US011237233B2

United States Patent
Yan et al.

(10) Patent No.: US 11,237,233 B2
(45) Date of Patent: Feb. 1, 2022

(54) SELF-DECOUPLED RF COIL ARRAY FOR MRI

(71) Applicant: VANDERBILT UNIVERSITY, Nashville, TN (US)

(72) Inventors: Xinqiang Yan, Nashville, TN (US); John C. Gore, Nashville, TN (US); William A. Grissom, Nashville, TN (US)

(73) Assignee: Vanderbilt University, Nashville, TN (US)

( * ) Notice: Subject to any disclaimer, the term of this patent is extended or adjusted under 35 U.S.C. 154(b) by 133 days.

(21) Appl. No.: 16/495,135

(22) PCT Filed: Mar. 21, 2018

(86) PCT No.: PCT/US2018/023482
§ 371 (c)(1),
(2) Date: Sep. 18, 2019

(87) PCT Pub. No.: WO2018/175530
PCT Pub. Date: Sep. 27, 2018

(65) Prior Publication Data
US 2021/0190889 A1 Jun. 24, 2021

Related U.S. Application Data

(60) Provisional application No. 62/474,771, filed on Mar. 22, 2017.

(51) Int. Cl.
*G01R 33/36* (2006.01)
*G01R 33/3415* (2006.01)

(52) U.S. Cl.
CPC ....... *G01R 33/365* (2013.01); *G01R 33/3415* (2013.01); *G01R 33/3635* (2013.01)

(58) Field of Classification Search
CPC ............ G01R 33/3415; G01R 33/3635; G01R 33/365
See application file for complete search history.

(56) References Cited

U.S. PATENT DOCUMENTS 4,095,168 A * 6/1978 Hlavka ............... G01R 33/3628
324/310
4,783,641 A * 11/1988 Hayes ................. G01R 33/341
324/318

(Continued)

FOREIGN PATENT DOCUMENTS

WO 2005109010 11/2005

OTHER PUBLICATIONS

International Search Report and Written Opinion dated May 16, 2018, from International Application No. PCT/US2018/023482, 11 pages.

(Continued)

*Primary Examiner* — Dixomara Vargas
(74) *Attorney, Agent, or Firm* — Meunier Carlin & Curfman LLC

(57) ABSTRACT

A self-decoupled RF coil and method for adjusting the same is disclosed. The RF coil is an array of elements including at least one loop. Electromagnetic coupling between elements in the array causes an induced current in the at least one loop. The induced current has two modes. A reactance inserted in the at least one loop balances the two modes. The balanced current modes cancel. This cancelation results in self-decoupling of the at least one loop from the other elements in the RF coil array.

20 Claims, 12 Drawing Sheets

(56) References Cited

U.S. PATENT DOCUMENTS

| | | | | |
|---|---|---|---|---|
| 5,091,708 | A * | 2/1992 | Bezjak | H03H 7/42 324/318 |
| 5,280,247 | A * | 1/1994 | DeMeester | G01R 33/385 324/318 |
| 5,530,355 | A * | 6/1996 | Doty | G01R 33/385 324/318 |
| 6,208,884 | B1 * | 3/2001 | Kumar | A61B 5/4244 600/409 |
| 6,418,335 | B2 * | 7/2002 | Avrin | A61B 5/4244 600/409 |
| 6,453,189 | B1 * | 9/2002 | Gilderdale | G01R 33/34084 600/423 |
| 7,047,059 | B2 * | 5/2006 | Avrin | G01V 3/08 600/409 |
| 7,911,209 | B2 * | 3/2011 | Alradady | G01R 33/34076 324/318 |
| 7,972,371 | B2 * | 7/2011 | Martin | A61F 2/86 623/1.15 |
| 9,306,635 | B2 * | 4/2016 | Kurs | H02J 50/20 |
| 9,638,771 | B2 * | 5/2017 | Soutome | G01R 33/3678 |
| 9,684,044 | B2 * | 6/2017 | Habara | G01R 33/3453 |
| 9,817,090 | B2 * | 11/2017 | Sambandamurthy | A61B 5/055 |
| 2002/0169374 | A1 | 11/2002 | Jevtic | |
| 2004/0254419 | A1 * | 12/2004 | Wang | A61L 31/16 600/8 |
| 2006/0136039 | A1 * | 6/2006 | Martin | A61F 2/86 623/1.16 |
| 2008/0275332 | A1 * | 11/2008 | Alradady | G01R 33/34076 600/422 |
| 2009/0322633 | A1 | 12/2009 | Yun et al. | |
| 2011/0312499 | A1 | 12/2011 | Vaughan et al. | |
| 2014/0167758 | A1 * | 6/2014 | Sambandamurthy | A61B 5/055 324/322 |
| 2014/0239953 | A1 | 8/2014 | Luong et al. | |
| 2015/0137815 | A1 | 5/2015 | Lakshmanan et al. | |

OTHER PUBLICATIONS

Hong, S. et al. in "New Design Concept of Monopole Antenna Array for UHG 7T MRI," Mag. Res. in Med., 71, pp. 1944-1952 (2014).

Raaijmakers, et al., "Design of a Radiative Surface Coil Array Element at 7T: The Single-Side Adapted Dipole Antenna," Mag. Res. in Med., 66, pp. 1488-1497 (2011).

* cited by examiner

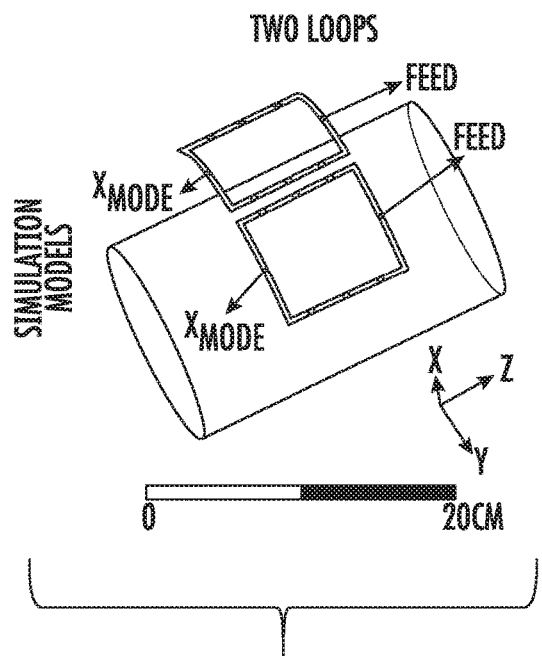
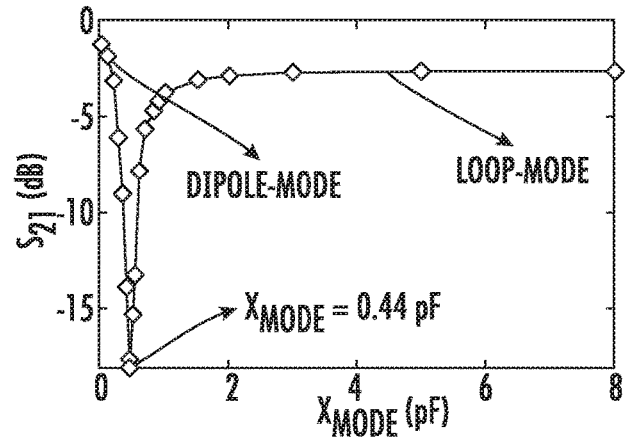
FIG. 7A
FIG. 7B
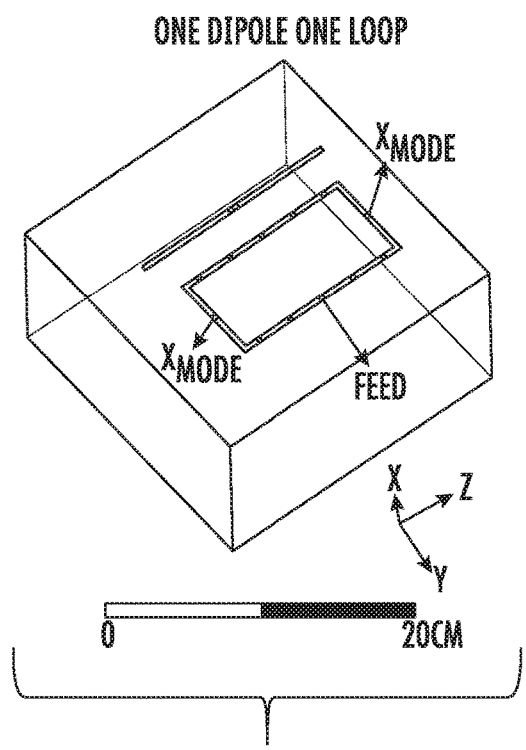
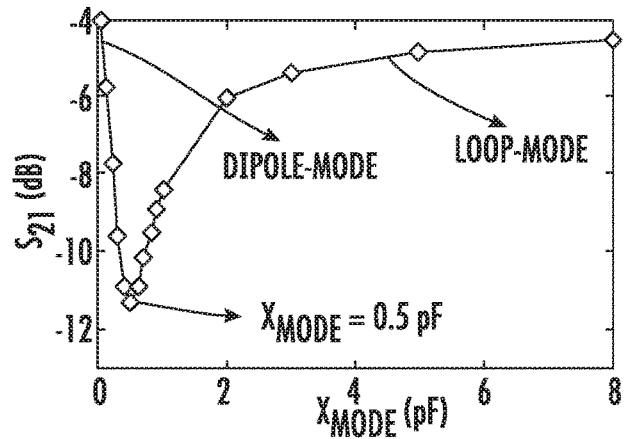
FIG. 8A
FIG. 8B

SELF-DECOUPLED RF COIL ARRAY FOR MRI

CROSS-REFERENCE TO RELATED APPLICATION

This application claims the benefit of U.S. Provisional Application No. 62/474,771, which was filed Mar. 22, 2017, and which is hereby incorporated by reference in its entirety.

GOVERNMENT SUPPORT

This invention was made with government support under NIH R01 EB 016695 and NIH R21 EB 018521, both awarded by the National Institute of Health. The government has certain rights in the invention.

FIELD OF THE INVENTION

The present disclosure relates to magnetic resonance imaging (MRI) and more specifically to a radio frequency (RF) coil array for parallel imaging and parallel transmission.

BACKGROUND

Radio frequency (RF) arrays consisting of a plurality of elements are desirable for parallel imaging and parallel transmission in magnetic resonance imaging (MRI). In general, parallel imaging and parallel transmission are improved as the number of elements in the RF array increases. For example, given two arrays that differ in the number of elements, the array with more elements may offer improved imaging characteristics, such as signal-to-noise ratio (SNR), acquisition time, and/or uniformity. Unfortunately, increasing the number of elements results in an increase in electromagnetic (EM) coupling between the elements. EM coupling affects the performance of the RF array negatively and can reduce the efficiency of the coil because energy that could be delivered to a subject is coupled between array elements instead. Accordingly, it is desirable to reduce EM coupling (i.e., coupling) between elements in an RF coil array.

There exists a variety of methods to reduce coupling (i.e., increase decoupling) in an array. One method includes overlapping adjacent elements in the array. Another method includes incorporating inductive/capacitive (L/C) networks connecting elements of the array. Still another method includes incorporating an auxiliary resonator with the elements array. These methods may significantly reduce coupling between adjacent elements however, these methods are less effective in reducing coupling between non-adjacent elements and may reduce the array's efficiency.

Recently, there has been interest in using mixed-type arrays for MRI. A mixed-type array includes a plurality of elements of different types. For example, a mixed array may include various combinations of elements selected from a group including dipoles, monopoles, and loops. Dipole elements for MRI are described by Raaijmakers, et al., in "Design of a Radiative Surface Coil Array Element at 7T: The Single-Side Adapted Dipole Antenna," *Mag. Res. in Med.*, 66, pgs. 1488-1497 (2011). Monopole elements for MRI are described by Hong, et al. in "New Design Concept of Monopole Antenna Array for UHG 7T MRI," *Mag. Res. in Med.*, 71, pgs. 1944-1952 (2014). These references are hereby incorporated by reference in their entirety.

Mixed-type arrays also require decoupling between elements. Unfortunately, the methods for decoupling described above are typically unsuitable for mixed-type arrays.

A need, therefore, exists for an array having significant decoupling between adjacent and non-adjacent elements, wherein the decoupling technique is suitable for arrays having elements of mixed types.

SUMMARY

Accordingly, in one aspect, the present disclosure embraces a self-decoupled RF coil array for MRI. The RF coil array includes array elements that are arranged into a pattern. The array elements include a loop element and at least one additional element. The loop element includes conductive segments that are positioned along a path that begins and ends at the same point. The loop element also includes (i) a first port between adjacent conductive segments that connects the loop element to a first RF transmission line and (ii) one or more reactive components that are each between adjacent conductive segments. The at least one additional element includes at least one additional port connecting the at least one additional element to at least one additional RF transmission line. The self-decoupled RF coil also includes an RF source that is connected to one of the at least one additional RF transmission lines. The RF source causes one of the least one additional elements to transmit RF energy that induces a non-uniform current in the loop element. The non-uniform current is a superposition of (i) a loop-mode current flowing in a first direction and (ii) a dipole-mode current flowing in a second direction that is opposite to the first direction. The loop is self-decoupled from the at least one additional element by the one or more reactive components in the loop element, which cause the dipole-mode current and the loop-mode current to cancel one another.

In an exemplary embodiment of the RF coil array, the at least one additional element includes a dipole element, a monopole element, or an additional loop element.

In another exemplary embodiment of the RF coil array, the one or more reactive components include one or more capacitors having a reactance (Xmode) that corresponds to the amplitudes of the dipole-mode current and the loop-mode current.

In another exemplary embodiment of the RF coil array, the one or more reactive components include one or more capacitors or inductors that have a reactance (Xarm) that corresponds to the resonant frequency of the loop element.

In another exemplary embodiment of the RF coil array, the one or more reactive components include one or more capacitors or inductors having a reactance (Xmatch) that corresponds to the input impedance of the loop element.

In another exemplary embodiment of the RF coil array, the one or more reactive components are tunable.

In another exemplary embodiment of the RF coil array, the pattern of array elements forms a one-dimensional (1D) or two-dimensional (2D) RF surface coil array, and in a further possible embodiment, the RF surface coil array is non-planar. The array elements may overlap or not overlap in the surface coil array.

In another aspect, the present disclosure embraces a method for electrically adjusting a self-decoupled RF coil array for operation in MRI. The method begins with the operation of providing an RF coil array that includes a loop element and a second element adjacent to the loop element. Next, RF energy is transmitted to a feed port in the second element. The transmitted RF energy induces a non-uniform current in the loop element. The non-uniform current is a superposition of (i) a loop-mode current flowing in a first direction and (ii) a dipole-mode current flowing in a second direction that is opposite to the first direction. Then, a mode reactance (Xmode) is adjusted. The mode-reactance is in series with the loop element so that the adjustment causes the loop-mode current and the dipole-mode current to cancel each other. The cancellation electromagnetically decouples the loop element from the second element.

In an exemplary embodiment of the method, the mode-reactance (Xmode) is a capacitance.

In another exemplary embodiment, the method further includes the operation of adjusting at least one arm-reactance (Xarm) that is in series with the loop element. The adjustment tunes the resonant frequency of the loop element.

In another exemplary embodiment, the method further includes the operation of adjusting a matching-reactance (Xmatch) that is in series or in parallel with a feed port in the loop element to adjust the input impedance of the loop element.

In another exemplary embodiment of the method, the second element is a dipole element, a monopole element, or a second loop element.

For the case in which the second element is a second loop element, an embodiment of the method further includes the operation of transmitting RF energy to a feed port in the loop element to induce, in the second loop element, a non-uniform current that is the superposition of (i) a loop-mode current flowing in a first direction and (ii) a dipole-mode current flowing in a second direction opposite to the first direction. Then, a mode-reactance in series with the second loop element is adjusted so that the loop-mode current and the dipole-mode current cancel each other.

For the case in which the second element is a second loop element, another embodiment of the method further includes the operation of adjusting at least one arm-reactance (Xarm) in series with the second loop element to tune the resonant frequency of the second loop element For the case in which the second element is a second loop element, another embodiment of the method further includes the operation of adjusting a matching-reactance (Xmatch) in series or in parallel with a feed port in the second loop element to adjust the input impedance of the second loop element.

In another aspect, the present disclosure embraces an MRI system. The MRI system includes a plurality of transmit/receive (T/R) RF channels and an RF coil array with at least one loop element and one dipole element that are each connected to one of the plurality of T/R channels. Transmitting on the dipole element induces a non-uniform current in the loop element that is the superposition of (i) a loop-mode current flowing in a first direction around the loop and (ii) a dipole-mode current flowing in a second direction opposite to the first direction. The loop element includes a reactive component (Xmode) that electromagnetically decouples the loop element from the dipole element by causing the amplitudes of the loop-mode current and the dipole-mode current to be equal.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

FIG. 7A graphically depicts a loop-loop RF coil array according to an exemplary embodiment of the present disclosure.

FIG. 7B is a graph showing the coupling (S21) between elements in the loop-loop RF coil array of FIG. 7A versus the loop's Xmode reactance.

FIG. 8A graphically depicts a dipole-loop RF coil array according to an exemplary embodiment of the present disclosure.

FIG. 8B is a graph showing the coupling (S21) between elements in the dipole-loop RF coil array of FIG. 8A versus the loop's Xmode reactance.

DETAILED DESCRIPTION

The present disclosure embraces a self-decoupled RF coil array for MRI. It should be noted that for the purposes of discussion the self-decoupled RF coil array might be referred to in various ways (e.g., array, coil, RF coil, coil array, RF coil array, and the like). These various ways are not limiting and refer to the same apparatus for receiving and/or transmitting RF energy from/to a subject/sample as part of magnetic resonance imaging.

The RF coil array is typically used as a surface coil array that is placed proximate to area during magnetic resonance imaging for transmitting and/or receiving RF energy to/from the area. As a result, the RF coil array may also be referred to specifically as a surface RF coil array. In some possible embodiments, however, the RF coil array may be configured to excite a volume. For example, the RF coil array may be wrapped around a volume to so that the RF energy transmitted/received to/from the RF coil array collectively is substantially homogenous throughout the volume.

The RF coil array includes a plurality of array elements (i.e., elements) that each transmit/receive RF energy substantially at a frequency (e.g., resonant frequency). The frequency may be adjusted for various MRI systems. More specifically, the frequency may be adjusted to correspond with the magnetic flux density of a magnet used by the MRI system. The present disclosure illustrates particular coil designs for a MRI system having a seven tesla (T) magnet wherein the particular frequency is approximately 300 megahertz (MHz) (e.g., 298 MHz), but other coils designs having different particular frequencies are within the scope of the present disclosure.

The number of elements in the plurality of elements of the RF coil array may depend on a variety of factors. One possible factor is the size and/or shape of the area for imaging. Another possible factor is the tissue and/or organ that is imaged. Still another possible factor is the number of transmit/receive (T/R) channels available from a particular MRI system (i.e., MRI scanner or scanner).

The elements of the RF coil array may be arranged in a variety of ways. Typically, the elements are arranged in an equal-spaced pattern. In other words, each element is separated from a neighboring element by a distance that repeats from element to element. As will be described in detail below, the instant disclosure embraces electromagnetically decoupling one or more elements in the coil array. Because one or more elements are decoupled, no overlapping of the elements is required. In addition, a physical connection between elements using conductors and/or circuit elements is not required. FIGS. 1A-1D graphically depict a non-limiting set of arrangements (i.e., configurations) consistent with self-decoupled RF coil arrays embraced by the instant disclosure.

Figure 1A:
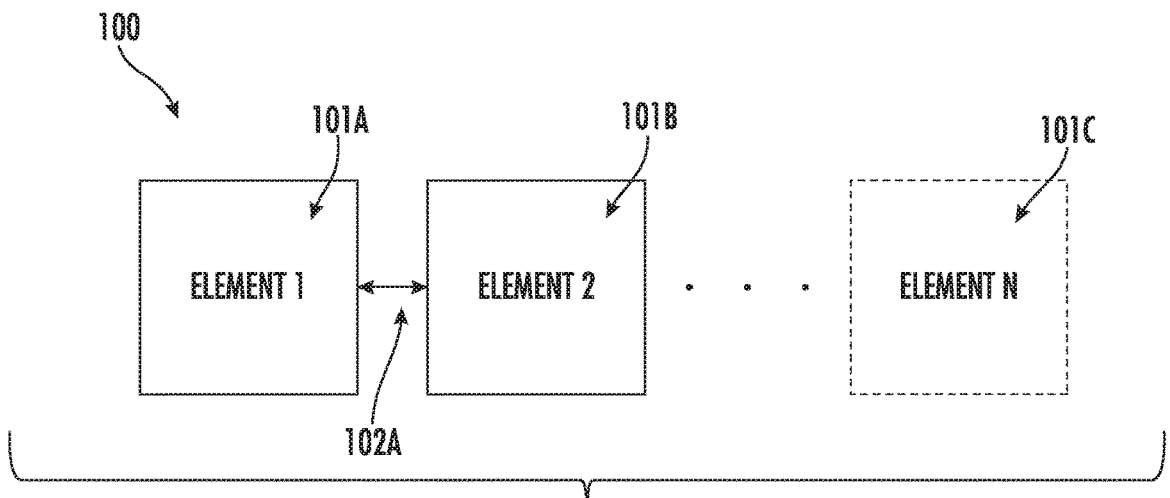
FIG. 1A graphically depicts exemplary one-dimensional (1D) RF coil array configurations suitable for possible embodiments of the present disclosure.

FIG. 1A illustrates a one-dimensional (1D) coil array 100. The 1D coil array includes elements 101a-101c arranged along a line. The elements 101A-C may each be the same type (e.g., loop, dipole, or monopole) or may collectively include one or more different types. The elements are separated by a separation distance 102. The separation distance 102 is typically small relative to the wavelength of the particular resonant frequency for the elements. For example, for a wavelength of one-hundred centimeters (cm) (i.e., 300 MHz) may require a separation distance of less than 5 cm (e.g., between 1 cm and 4.5 cm). The particular separation distance 102 may also be selected based on the electromagnetic (EM) coupling desired between elements 101A-C, which as will be discussed further below, can depend the type of elements used in the RF coil array.

Figure 1B:
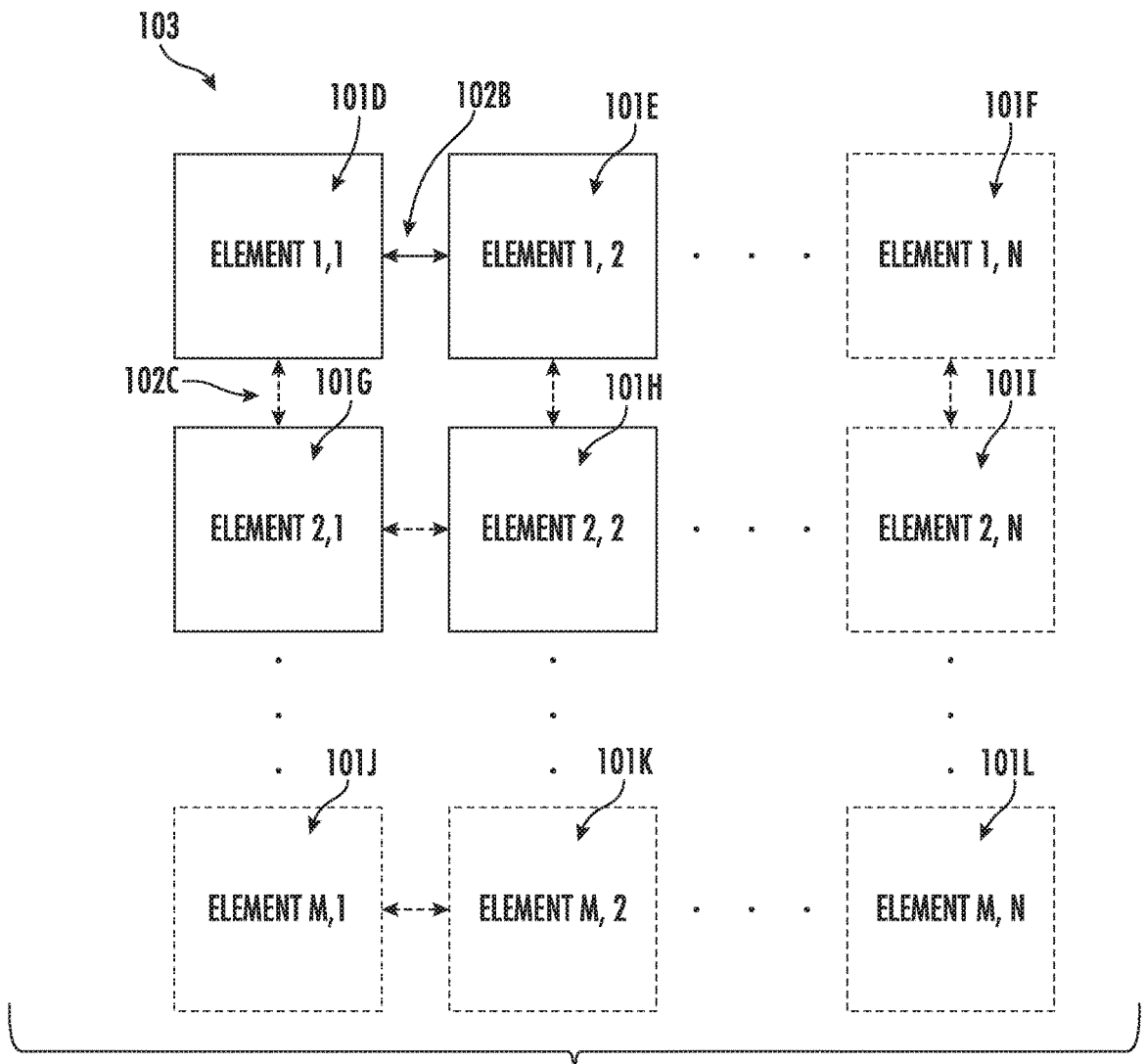
FIG. 1B graphically depicts exemplary two-dimensional (2D) RF coil array configurations suitable for possible embodiments of the present disclosure.

FIG. 1B illustrates a two-dimensional (2D) coil array 103. The 2D coil array includes elements 101D-L arranged in a grid pattern. The elements 101D-L may each be the same type (e.g., loop, dipole, or monopole) or may collectively include one or more different types. The elements of the 2D array have the same electrical properties described above for the elements the 1D coil array and are separated by a horizontal separation distance 102E and a vertical separation distance 101C. Typically, the horizontal and vertical separation distances are equal but in some embodiments, they may be different.

Figure 1C:
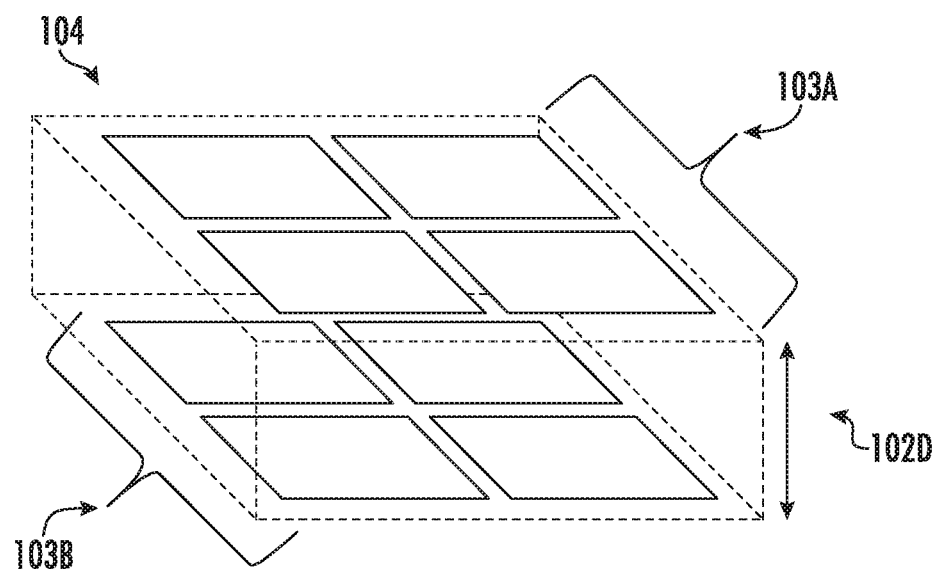
FIG. 1C graphically depicts an exemplary three-dimensional (3D) RF coil array configuration suitable for an embodiment of the present disclosure.

FIG. 1C graphically illustrates a possible three-dimensional (3D) coil array 104 embodiment. The exemplary 3D coil array consists of two 2D RF coil array as described above. An upper 2D coil array 103A is aligned with a lower 2D coil array 103B. The two 2D coil arrays separated in a direction transverse to the plane of each coil array by a transverse separation distance 102D. Typically, the transverse separation distance is smaller than the horizontal or vertical separation between elements. For example, a coil array with horizontal/vertical separation distances of 1 cm may have a transverse separation distance of 1 millimeter (mm). The transverse separation is typically achieved by fabricating elements on opposite surfaces of a substrate. For example, well-known circuit etching techniques may be used to fabricate coil array elements onto the surfaces of the substrate.

The substrate material for 1D, 2D or 3D coil arrays is chosen to have a low loss at the resonant frequency of the coil array (e.g., loss tangent less than 0.001). For example, substrate materials comprised of PTFE or thermoplastic may be used for the RF coil array. In some cases, the substrate material may be flexible so that the substrate may be curved into non-planar configuration.

Figure 1D:
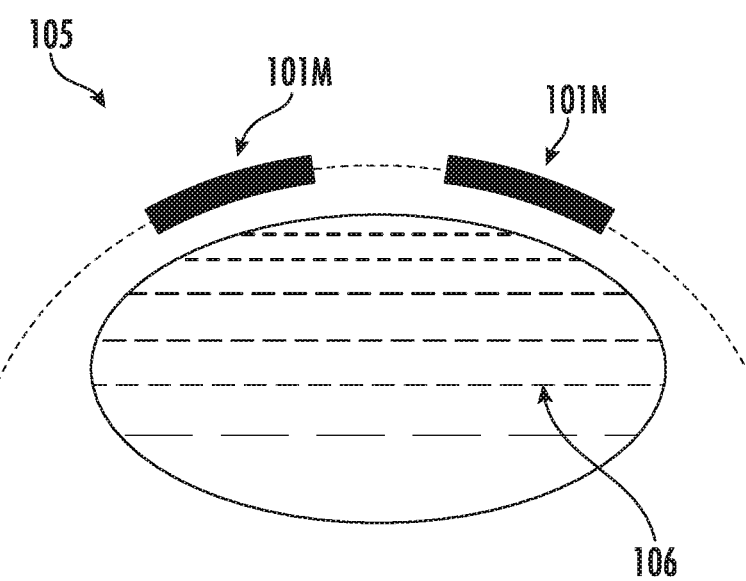
FIG. 1D graphically depicts an exemplary RF coil array configuration according to a possible implementation of the present disclosure.

FIG. 1D graphically illustrates a non-planar RF coil array 105. As shown, the non-planar RF coil array 105 consists of two elements 101M, 101N. The elements are curved about a subject/sample 106 for imaging. The subject/sample 106 may be a person, animal, or a sample tissue. In some cases, the subject/sample 106 may be a phantom comprised of a cylinder or tank containing a fluid having properties similar to a subject for testing. For example, a phantom may be used for tuning reactive elements in the RF coil array prior to imaging.

Figure 2:
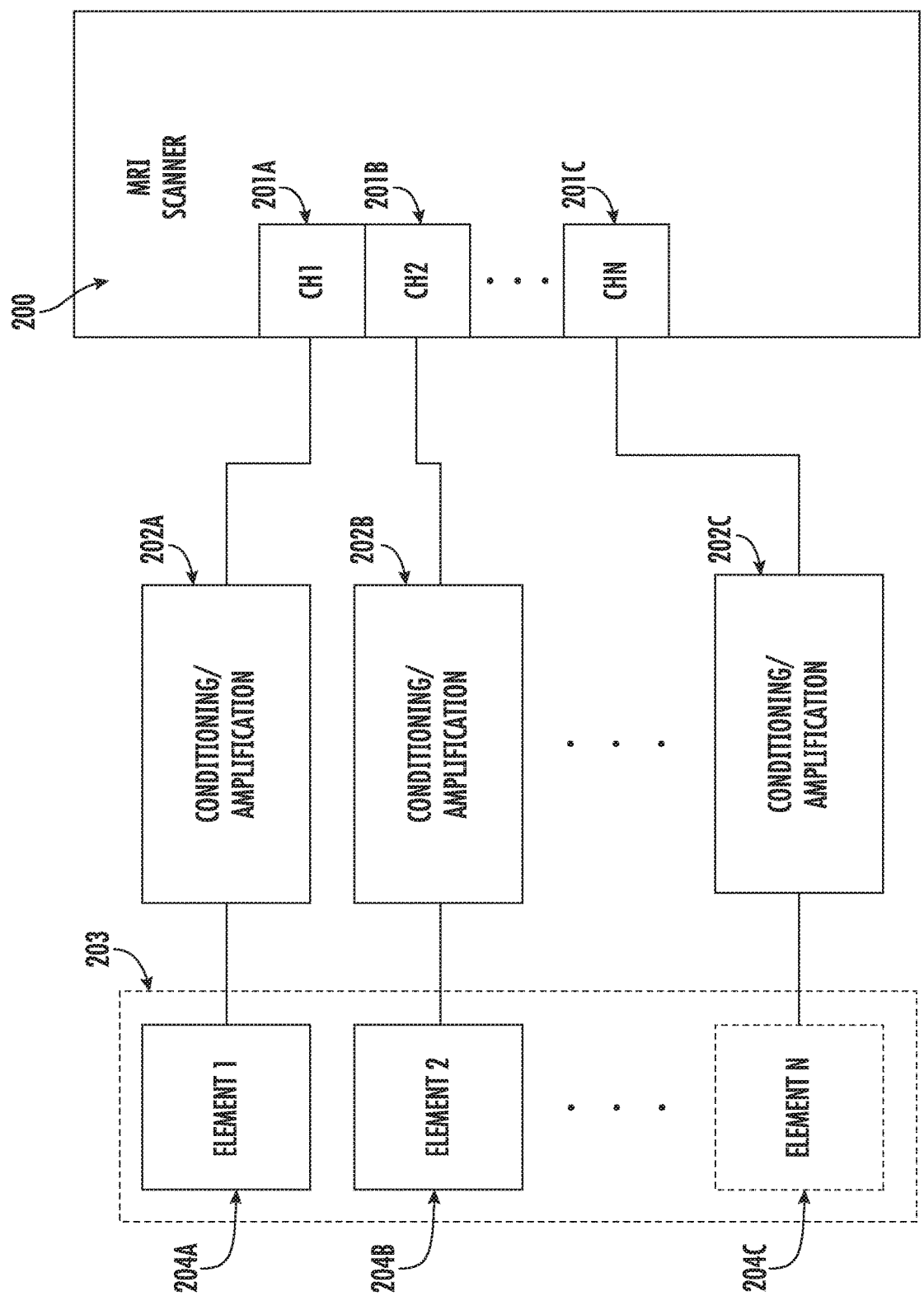
FIG. 2 schematically depicts an MRI system according to an embodiment of the present invention.

FIG. 2 schematically depicts an MRI system according to an embodiment of the present disclosure. The system includes an MRI scanner 200 with a plurality of transmit/receive channels 201A-C for transmitting and receiving RF energy to/from an RF coil array 203. As described above, the RF coil array includes a plurality of element 204A-C that each are connected to one of the MRI scanner's 200 T/R channels 201A-C. The elements 204A-C may be connected to the T/R channels directly using a transmission line (e.g., coaxial cable) but typically are connected to one or more circuits for conditioning and amplifying the RF signal that is situated between the MRI scanner 200 and the RF coil array 203. The conditioning/amplification stages 202A-C may include circulators, amplifiers, filters, switches, limiters, and the like for adjusting the RF signals transmitted and received between the RF coil and the MRI scanner.

Figure 3A:
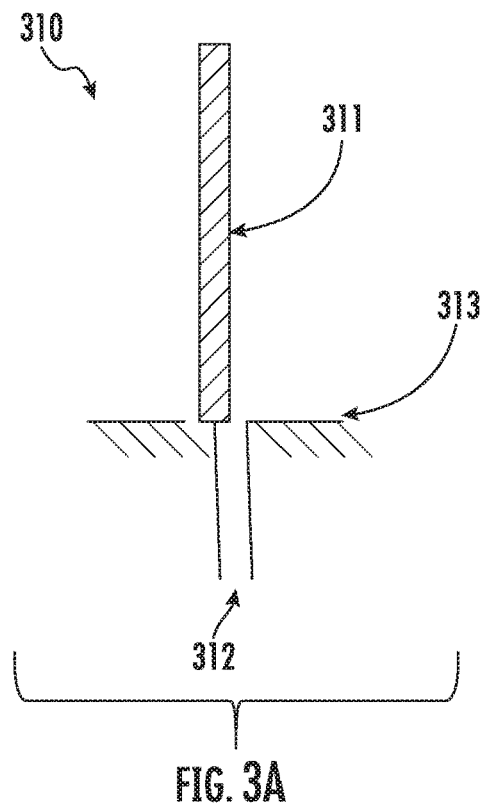
FIG. 3A graphically depicts an exemplary monopole element that is suitable for possible embodiments of the present disclosure.
Figure 3B:
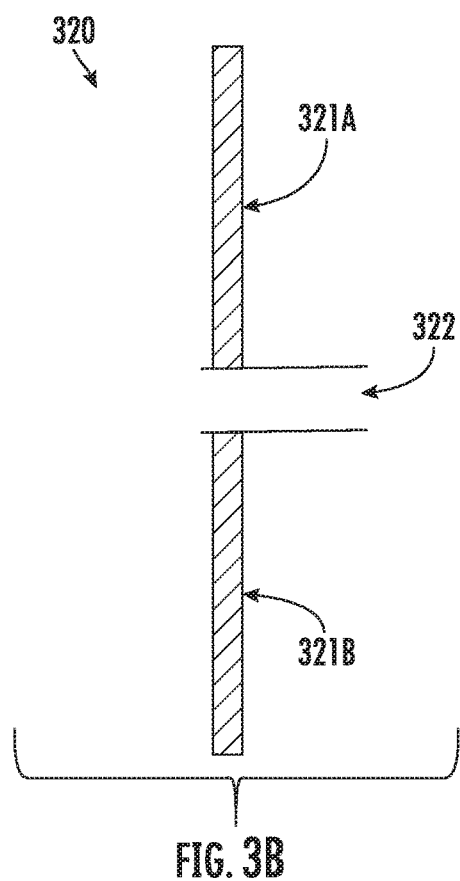
FIG. 3B graphically depicts an exemplary dipole element that is suitable for possible embodiments of the present disclosure.

The elements of the RF coil array may be a loop, a monopole, or a dipole. FIG. 3A graphically depicts a monopole element 310. The monopole element 310 includes conductive segment 311 situated over a ground plane 313. RF energy is transmitted to (or received from) the monopole element 310 by a port 312. FIG. 3B graphically depicts a possible dipole element. The dipole element 320 includes a first conductive segment 321A and a second conductive segment 321B. RF energy is transmitted to (or received from) the monopole element 310 by a port 322.

Figure 3C:
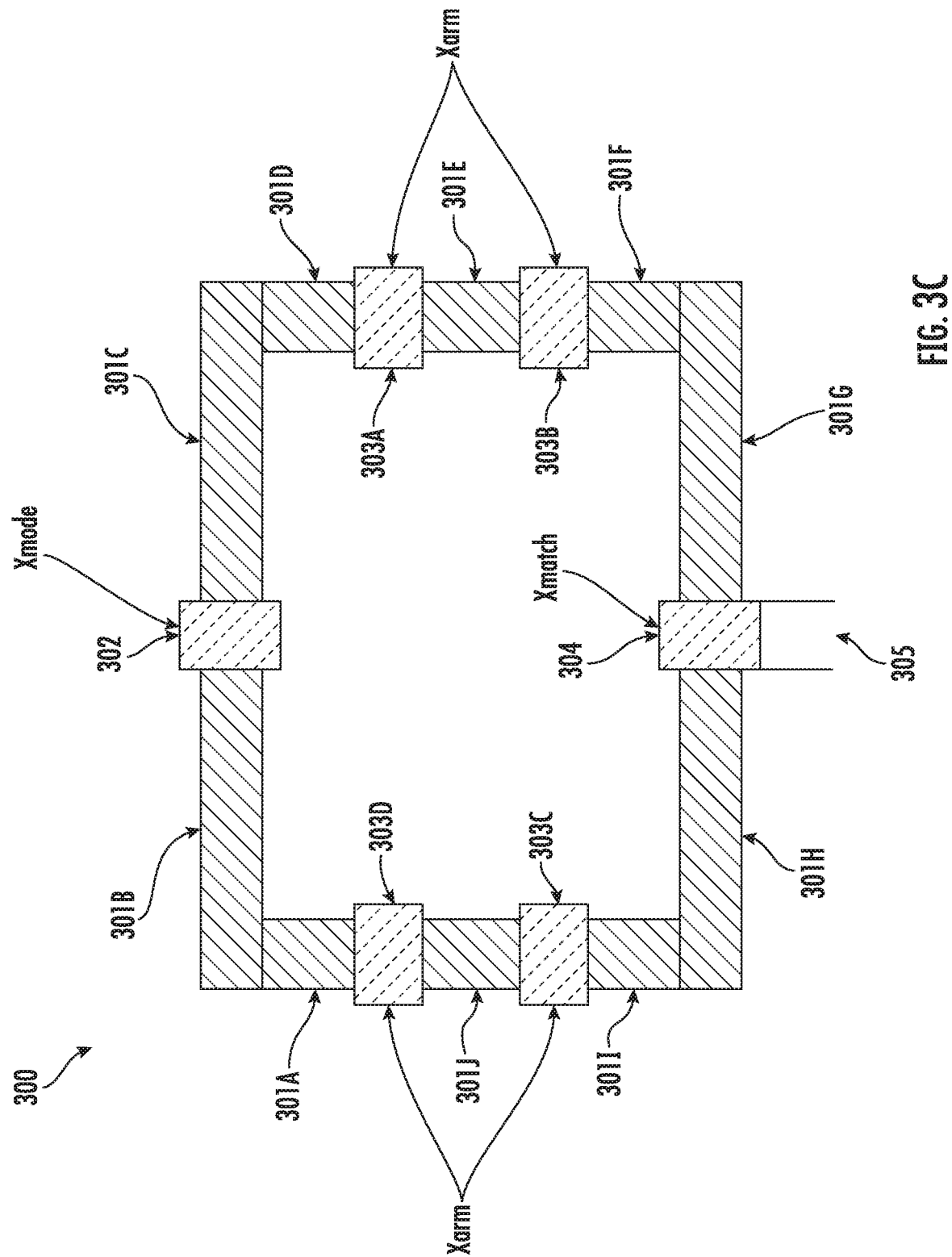
FIG. 3C graphically depicts an exemplary loop element that is suitable possible embodiments of the present disclosure.

FIG. 3C graphically depicts a possible loop element 300. The loop element 300 consists of conductive segments 301A-K positioned along a path that begins and ends at the same point to form the loop element. The shape of the loop element may vary. For example, the loop element may be square, rectangular, circular, or the like. Accordingly, the conductive segments may be curved or straight. In some cases, the conductive segments do not correspond in a one-to-one relationship with a side of the loop element. For example, the right side of the loop element shown in FIG. 3C is comprised of three segments 301D-F. Adjacent conductive segments may be connected together (e.g., 301A and 301B) or may be connected in series with a reactive component 302 (e.g., 301B and 301C) or port (e.g., 301G and 301H).

The loop element 300 may include one or more reactive components between adjacent conductive segments. A reactive component may be capacitive (i.e., capacitor) or inductive (i.e., inductor). The reactive component may be embodied as a single inductor or capacitor. Alternatively, the reactive component may embodied as a series/parallel combination of inductors and/or capacitors to form a reactance. In some embodiments, the one or more of the reactive components are electrically or mechanically tunable over a range of reactance values.

The reactive components in a loop element may be used for various functions. For example, one or more reactive components 304 may be used for impedance matching (Xmatch). As shown in FIG. 3C, a reactive component for matching 304 may be placed in a parallel (or series) connection with a port 305. When a transmission line is connected to the port of the loop element 305, the reactance of the reactive component 304 for matching (Xmatch) may be adjusted to insure efficient RF energy coupling between the transmission line and the loop element. In other words, Xmatch may be used to adjust the input impedance of the loop element to the impedance (e.g., 50 ohms) of a transmission line (e.g., coaxial cable). By matching impedance, RF energy transmitted to the feed port 305 is efficiently transmitted into the loop element. The feed port 305 may be in the center of an element as shown in FIG. 3C but may also be positioned anywhere along the element (e.g., at a corner).

One or more reactive components 303A-D (Xarm) in the loop element 300 may also be used to align the resonance of the loop element with a particular frequency (i.e., resonance frequency) regardless of the loop elements physical size. For example, without the use of reactive elements a loop element having a resonance frequency of 298 MHz would be too large for practical purposes. As shown in FIG. 3C, the reactance, Xarm, of the one or more reactive components 303A-D may be created using a plurality of capacitors/inductors arranged between a plurality of segments.

Figure 4:
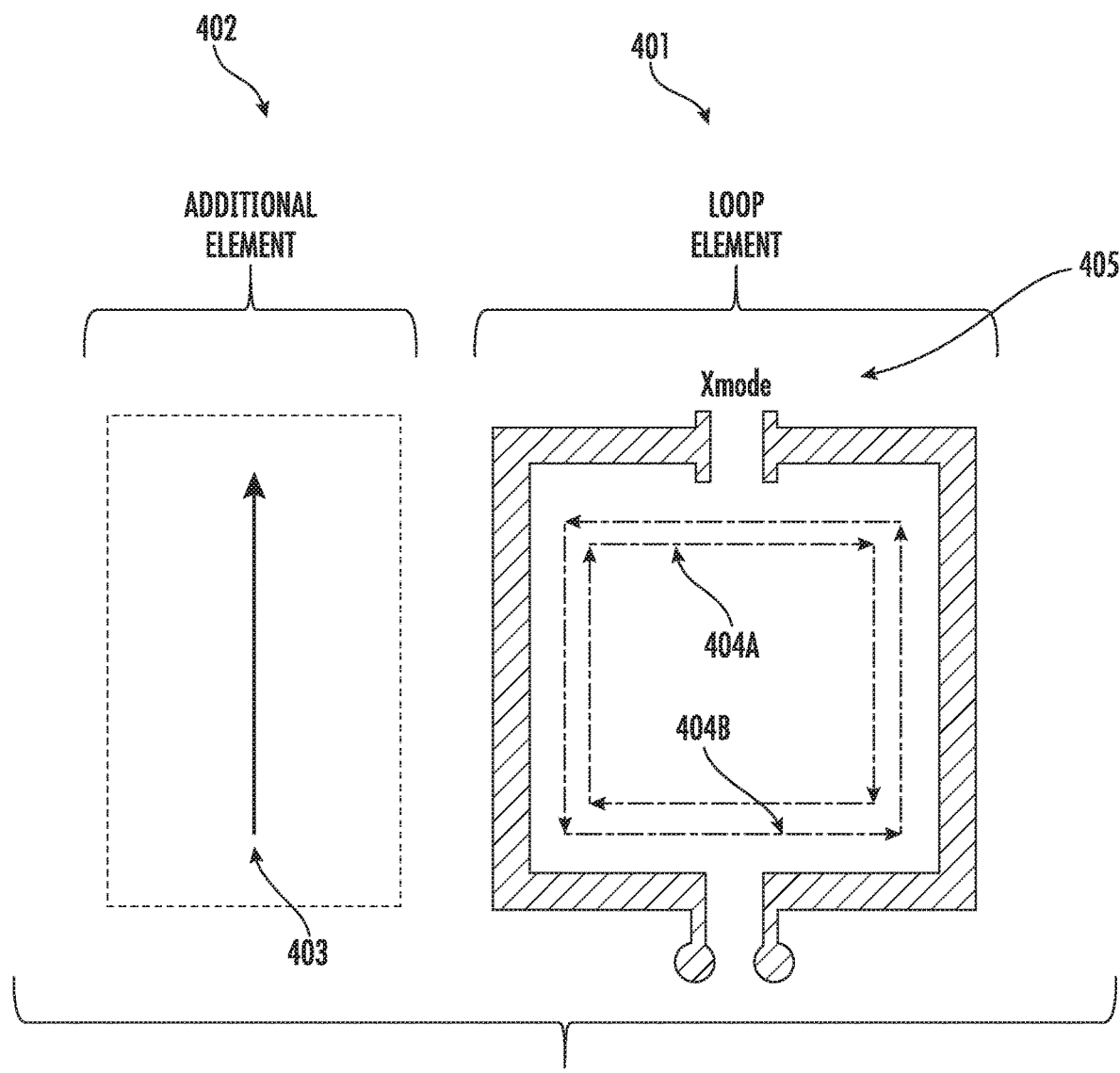
FIG. 4 graphically depicts possible current modes due to coupling between array elements in an exemplary embodiment of the present disclosure.

One or more reactive components 302 in the loop element (Xmode) 300 may also be used to self-decouple (i.e., decouple) the loop element electromagnetically from one or more adjacent elements in an RF coil array. FIG. 4 graphically depicts EM coupling between array elements. As shown, a loop element 401 is proximate to an additional element 402. The additional element 402 may be any type described thus far. For example, the additional element may be a loop, a monopole, or a dipole. An RF source (not shown) connected to a port of the additional element 402 causes a current 403 in to flow in the additional element 402. The current 403 in the additional element generates an electric field (i.e., E-field) and/or a magnetic field (i.e., H-field) around the additional element 402. Because the loop element is spaced a small distance (e.g., a distance smaller much smaller than the wavelength of the loop's resonant frequency) from the additional element 402, the fields generated by the additional element 402 induce a current in the loop element 401 (i.e., EM coupling). The induced current is the result of both E-field coupling and H-field coupling.

The induced current in the loop element is not uniformly distributed over the loop element. In other words, some conductive segments in the loop element may have a large induced current, while other conductive segments in the loop element may have a small induced current. The non-uniform induced current is a superposition of two current modes that result from coupling through the E-field and through the H-field. Accordingly, the current mode resulting from H-field coupling is known is loop-mode current 404A and the current mode resulting from E-field coupling is the dipole-mode current 404B. The loop-mode current and the dipole-mode current flow in opposite directions.

Figure 5:
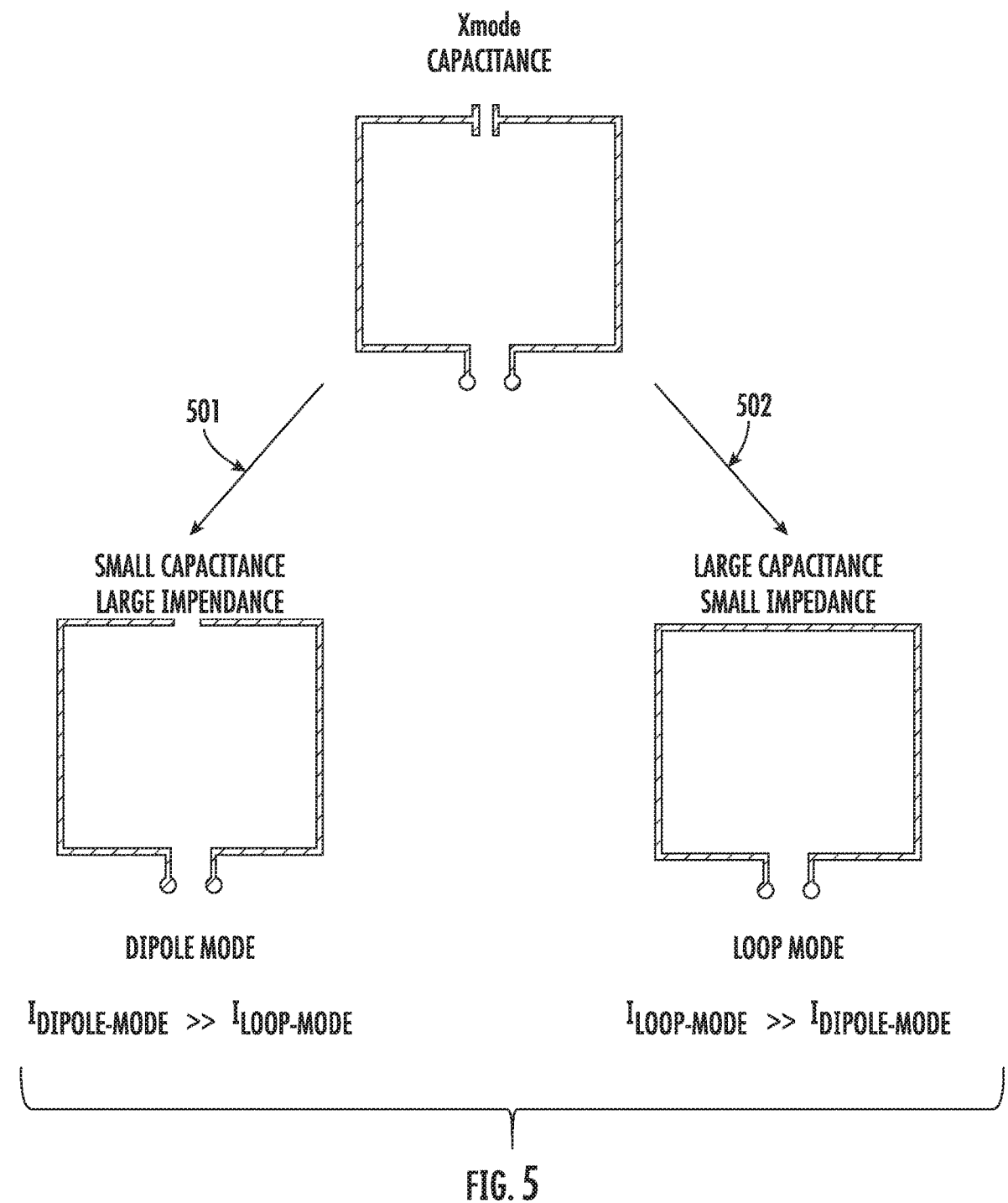
FIG. 5 graphically depicts the effects of changing a reactance (Xmode) in series with a loop element according to an embodiment of the present disclosure.

The two modes are possible because a loop with a reactive component (Xmode), such as a capacitor, may operate like a dipole, like a loop, or somewhere in between depending on the value of the reactance (e.g., capacitance). FIG. 5 illustrates this concept. For a given frequency of operation, a capacitive Xmode will have a large impedance for small values of capacitance and will have a small impedance for large values of capacitance. Thus, at one extreme the impedance of a small capacitor open circuits the loop so that the loop behaves like a dipole (i.e., dipole mode). At this extreme 501, the current in the loop is dominated by the dipole-mode current. At the other extreme 502, the impedance of a large capacitor short circuits the loop so that the loop behaves like a loop (i.e., loop mode). At this extreme, the current in the loop is dominated by the loop-mode current.

Because, the induced current is the superposition of the loop-mode current and the dipole-mode current (see FIG. 4) and because the contribution of the loop-mode current and the dipole mode current depends on a reactive component Xmode (see FIG. 5), it is possible to tune the current modes to match one another and cancel. In other words, Xmode may be adjusted so that the effective current induced in the loop by another element is zero. After Xmode is adjusted to balance the current modes, the loop is said to be self-decoupled from the adjacent element.

Figure 6A:
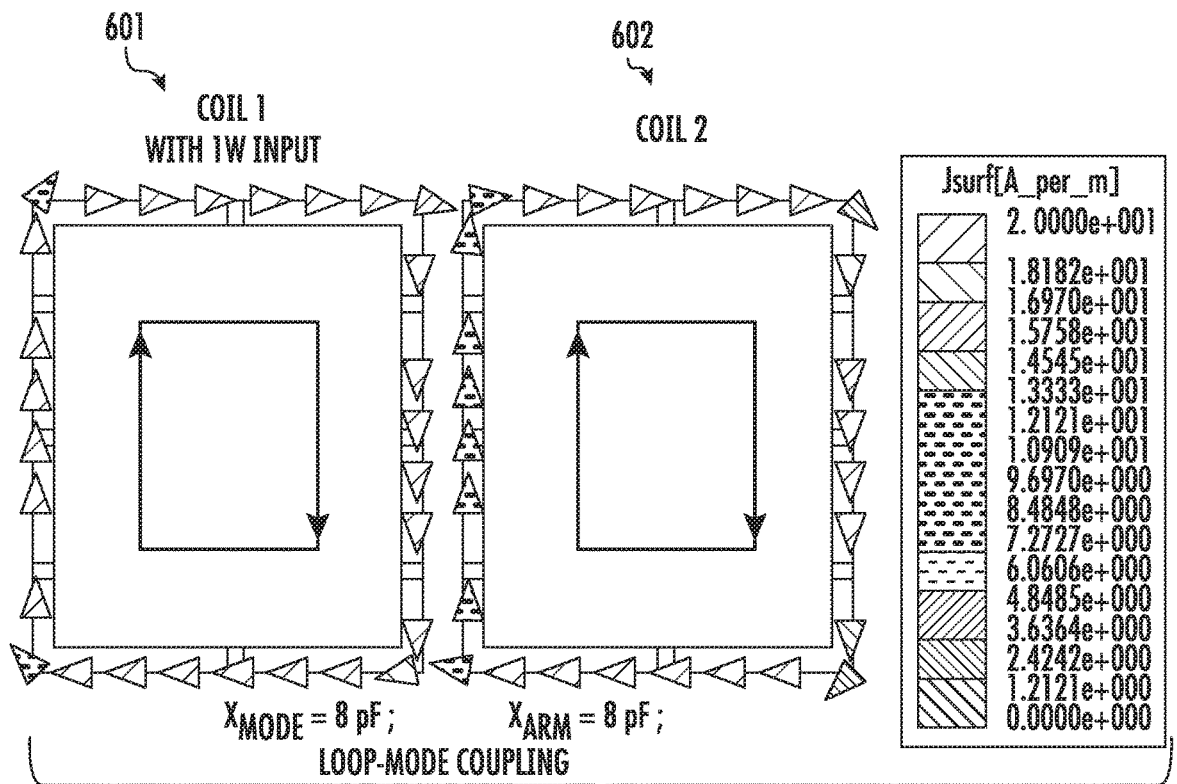
FIG. 6A graphically depicts loop-mode coupling between two loop elements according to an exemplary embodiment of the present disclosure.
Figure 6B:
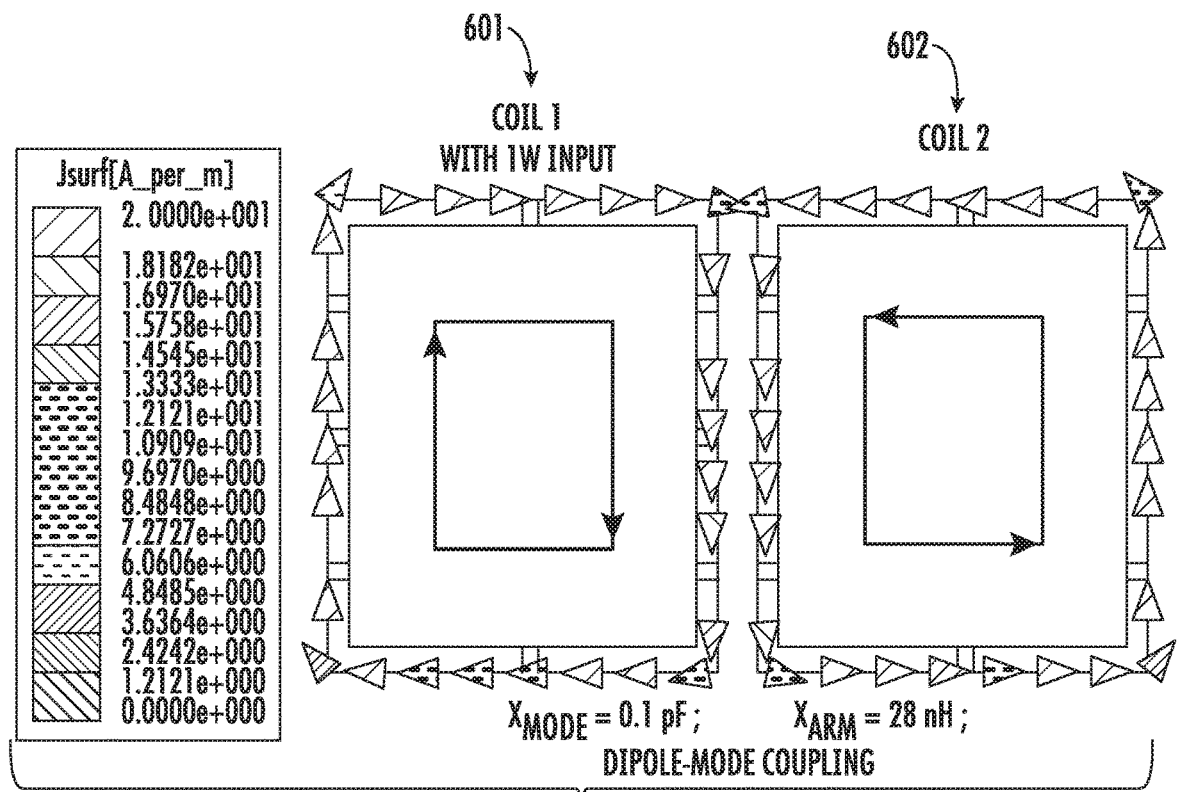
FIG. 6B graphically depicts dipole-mode coupling two loop elements according to an exemplary embodiment of the present disclosure.

FIGS. 6A and 6B graphically illustrate simulation results demonstrating how a reactance (Xmode) can be used to tune the current induced in a loop element between a loop-mode (FIG. 6A) and a dipole mode (FIG. 6B).

The current distributions of the loop mode are simulated in FIG. 6A. In the simulation, the transmitting loop element 601 is driven by one watt of RF energy at 298 MHz. The reactance of the coupled loop element 602, Xmode, equals eight pico-farads (8 pF). Because the capacitance is large, the impedance of Xmode is small, and a predominantly uniform current is expected. As can be observed, the current (arrows) in the coupled loop element 602 flows in the same direction as the current in the transmitting loop element 601. In addition, the current distribution in the coupled loop element is roughly uniform, as expected.

The current distributions of the dipole mode are simulated in FIG. 6B. In the simulation, the transmitting loop element 601 is driven by one watt of RF energy at 298 MHz. The reactance of the coupled loop element 602, Xmode, equals 0.1 pF. Because the capacitance is small, the impedance of Xmode is large, and a non-uniform current is expected. As can be observed, the current (arrows) in the coupled loop element 602 flows in the opposite direction as the current in the transmitting loop element 601. In addition, the current distribution in the coupled loop element not uniform, as expected for a dipole.

FIG. 7A shows a design of a two loop element army (i.e., loop-loop configuration for simulation. The loop elements have dimensions $10 \times 10$ cm$^2$ and are positioned 1 cm apart. The conductive segments of the loop are 7.5 millimeters (mm) and 35 microns (μm) thick. The loops are mounted on an acrylic tube with a diameter of 25 cm. A cylindrical phantom with 15 cm diameter and 20 cm length was placed 4.5 cm below the loops.

The scattering parameter, S21, measures the coupling between the loop elements. Ideally, an S21 of zero decibels (dB) indicates perfect coupling and an S21 of negative infinity dB equals no coupling. FIG. 7B shows the simulated results of the coupling as the reactive element (Xmode) is tuned over a range of values from 0 to 8 pico-Farads (pF). The simulation shows that for this array configuration, an Xmode capacitance of 0.44 pF decouples the loop elements.

FIG. 8a shows a design of an array consisting of a dipole element and a loop element (i.e., dipole-loop configuration). The dipole has dimensions 23×0.75 $cm^2$ and loop has dimensions 20×9.5 $cm^2$. The two elements are spaced 4 cm apart. A tank phantom with dimensions 35×30×20 $cm^3$ was placed 4.5 cm below the pair.

The scattering parameter, S21, measures the coupling between the loop elements FIG. 8B shows the simulated results of the coupling as the reactive element (Xmode) is tuned over a range of values from 0 to 8 pF. The simulation shows that for this array configuration, an Xmode capacitance of 0.5 pF decouples the loop element from the dipole element.

Each element in an RF coil array can be matched to 50 Ohms using one or more reactance, Xmatch, connected at the interface between a feed port and 50-Ohm transmission line (e.g., coax). In the designs described above, Xmatch is a tunable capacitor connected in parallel with a 50-ohm coax and the array element. Prior to imaging, Xmatch can be tuned so that the input impedance of the element is 50 ohms at the elements input port at 298 MHz. Then, after the coil array is placed adjacent to a sample for imaging, the value of Xmatch may be tuned again to compensate for loading from the sample.

Each element in an RF coil array can also be tuned to resonate at a particular frequency that is suitable for imaging (i.e., Larmor frequency) using one or more reactance (Xarm) connected in series with the element. For the loop-loop design described above, Xarm was an inductor having an inductance of about 30 nano-Henrys (nH). For the dipole-loop design described above, Xarm was about 40 pF.

Figure 9A:
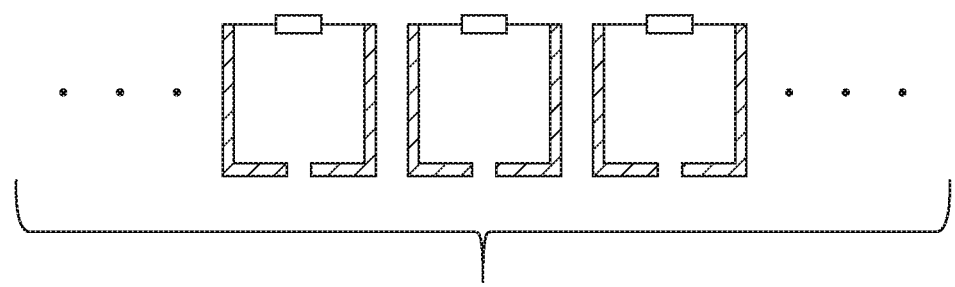
FIGS. 9A-9E graphically depict possible same-type RF coil arrays according possible embodiments of the present disclosure.

Various embodiments of the RF coil array are possible. FIG. 9A-9E illustrate several possible same-type coil implementations. FIG. 9A is a linear array of loop elements having a single Xmode reactance located in the conductive segment opposite from the port. The number of loop elements in the RF coil array can be two or more.

Figure 9B:
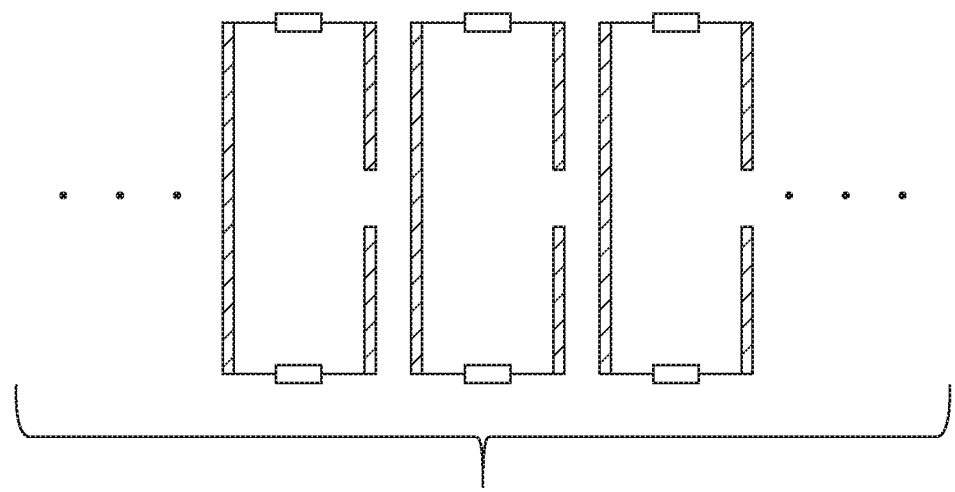

FIG. 9B is a linear array of loop elements having a two Xmode reactances located on opposite conductive segments loop opposite from the port. The number of loop elements in the RF coil array can be two or more.

Figure 9C:
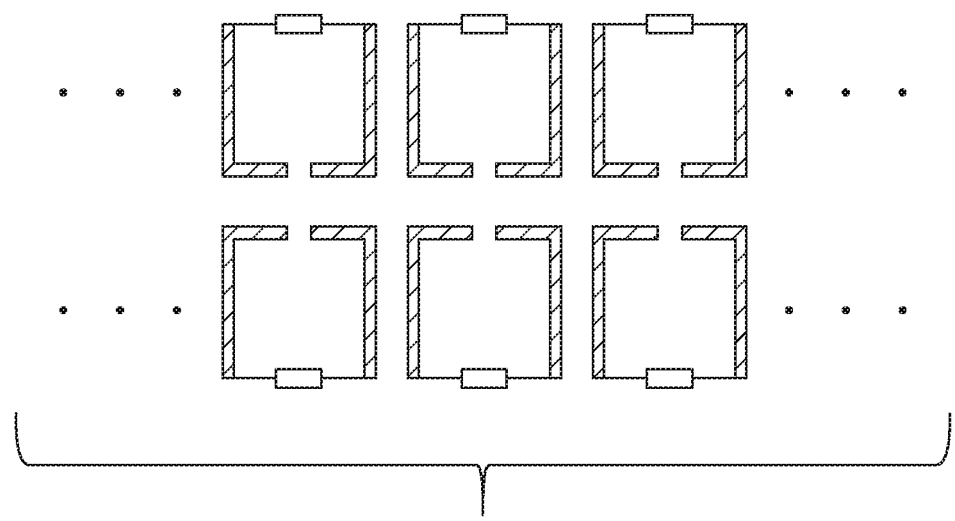

FIG. 9C is a 2D array of loop elements that each have a single Xmode reactance located a conductive segment of the loop opposite from the port. The 2D array is comprised of two linear arrays. The elements in one linear array mirrors its counterpart in the other linear array so that the reactive components, Xmode, in different linear arrays are separated as much as possible.

Figure 9D:
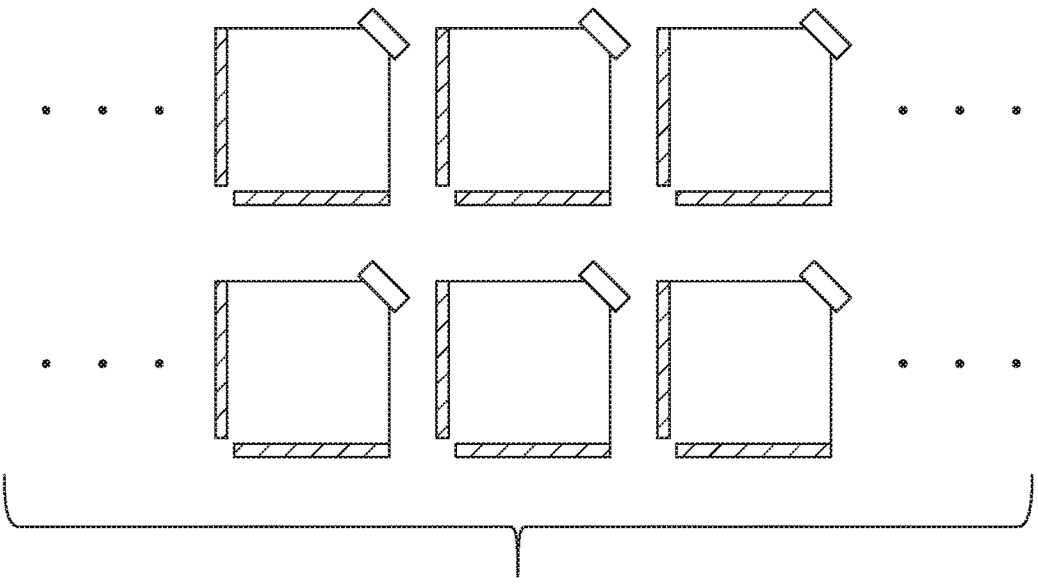

FIG. 9D is a 2D array of loop elements that each have a single Xmode reactance located a corner segment of the loop opposite from the port. The 2D array is comprised of two linear arrays. The elements have loop-mode and dipole-mode in both horizontal and vertical directions so that elements in both directions are decoupled.

Figure 9E:
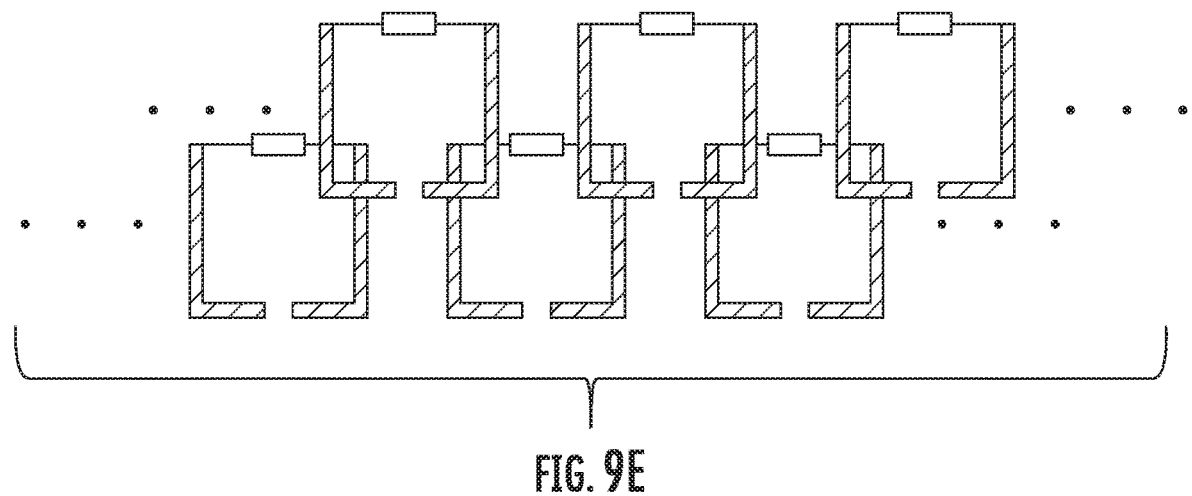

FIG. 9E is a 2D array of loop elements having a single Xmode reactance located in the conductive segment opposite from the port. The 2D array is comprised of two linear arrays. The loop elements in different rows are decoupled by overlapping.

Figure 10A:
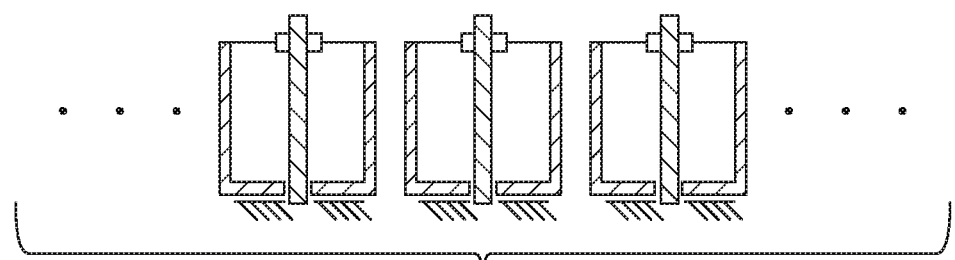
FIGS. 10A-10C graphically depict possible mixed-type RF coil arrays according to possible embodiments of the present disclosure.
Figure 10B:
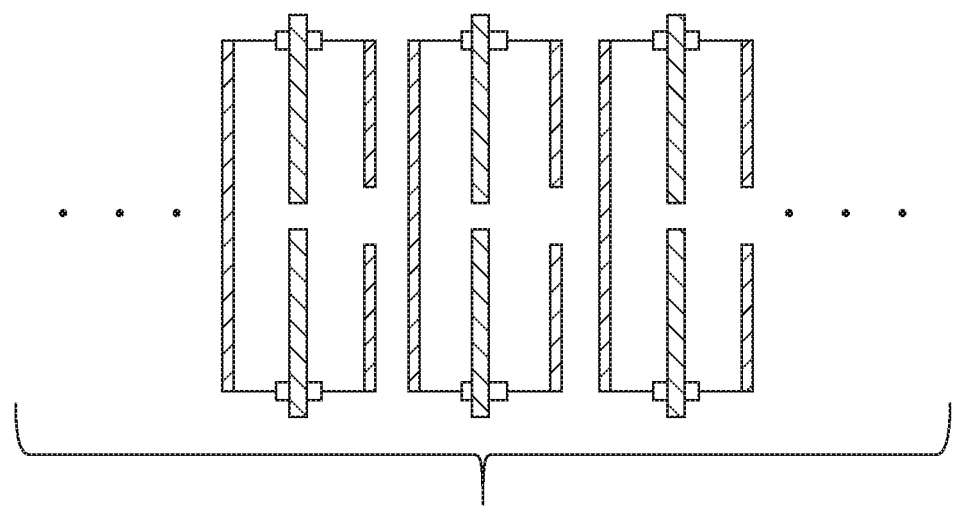
Figure 10C:
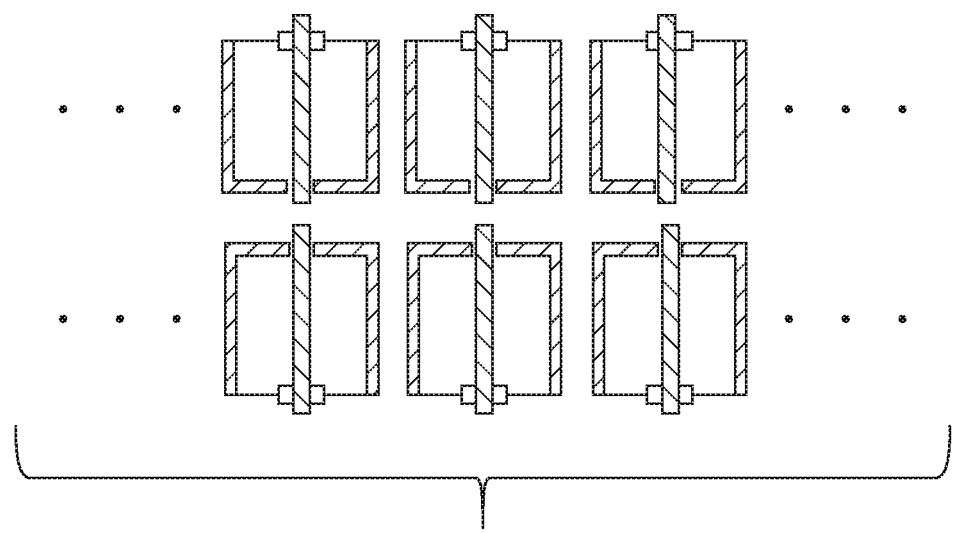

FIG. 10A-10C illustrate several possible mixed-type coil implementations. FIG. 10A is a 2D array comprising two linear arrays. The elements in one linear array are loops and the elements of the other linear array are monopoles. The array of monopoles is shown overlapping the array of loops. The spacing between the loops and the monopoles is small (e.g., 1 mm)

FIG. 10B depicts a 2D array comprising two linear arrays. The elements in one linear array are loops and the elements of the other linear array are dipoles. The linear array of loop elements have two Xmode reactances on each loop. The spacing between the loops and the dipoles is small (e.g., 1 mm)

FIG. 10C depicts a 3D array. The 3D array is comprised of a 2D array of loops and a linear array of dipoles positioned over the 2D array of loops.

The decoupling described thus far has been directed to the situation in which one element in a coil array is decoupled from another element in a coil array. It is envisioned that the techniques described may also be used to decouple the RF coil array from other sources of coupled RF energy. For example, an element may be decoupled, using the techniques disclosed, from another RF coil in the MRI setup (e.g., a receive coil). In another example, an element may be decoupled, using the techniques disclosed, from other metallic structures (or structure) in the MRI setup (e.g., within the bore of the MRI magnet).

The decoupling techniques described thus far may also be combined with other EM decoupling techniques. For example, methods such as overlapping elements, using transformers, or shielding may supplement the decoupling (e.g., in multi-row coils).

The methods described herein could also be used for applications other than decoupling. For example, a user could use the structures and techniques described to tune a loop coil to have a loop-like current distribution and EM field patterns at very high frequencies.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

The invention claimed is:

1. A self-decoupled radio-frequency (RF) coil array for magnetic resonance imaging (MRI), comprising:
   an array of elements arranged into a pattern, wherein the array of elements comprise a loop element and at least one additional element comprising a dipole element or a monopole element:
      the loop element, comprising:
         conductive segments positioned along a path that begins at and ends at the same point,
         a first port connecting the loop element to a first RF transmission line, the first port between two adjacent conductive segments in the loop element, and
         one or more reactive components that are each between two adjacent conductive segments; and
      the at least one additional element, comprising:
         at least one additional port connecting the at least one additional element to at least one additional RF transmission line; and
   an RF source connected to one of the at least one additional RF transmission lines causing one of the at least one additional elements to transmit RF energy, wherein:
the transmitted RF energy induces a non-uniform current in the loop element resulting from electric field (E-field) and magnetic field (H-field) coupling between the loop element and the at least on additional element that is the superposition of (i) a loop-mode current flowing in a first direction and (ii) a dipole-mode current flowing in a second direction that is opposite to the first direction,
wherein the one or more reactive components in the loop element electromagnetically decouples the loop element from the one of the at least one additional array elements by causing the dipole-mode current induced by the E-field coupling and the loop-mode current induced by the H-field coupling to cancel one another, and
wherein
the self-decoupled RF coil array receives and/or transmits RF energy from/to a subject/sample for MRI.

2. The self-decoupled RF coil array according to claim 1, wherein the at least one additional element comprises a dipole element.

3. The self-decoupled RF coil array according to claim 1, wherein the at least one additional element comprises a monopole element.

4. The self-decoupled RF coil array according to claim 1, wherein the at least one additional element comprises an additional loop element.

5. The self-decoupled RF coil array according to claim 1, wherein the one or more reactive components include one or more capacitors having a reactance (Xmode) that corresponds to the amplitudes of the dipole-mode current and the loop-mode current.

6. The self-decoupled RF coil array according to claim 1, wherein the one or more reactive components include one or more capacitors or inductors having a reactance (Xarm) that corresponds to the resonant frequency of the loop element.

7. The self-decoupled RF coil array according to claim 1, wherein the one or more reactive components include one or more capacitors or inductors having a reactance (Xmatch) that corresponds to the input impedance of the loop element at the first port.

8. The self-decoupled RF coil array according to claim 1, wherein the one or more reactive components are tunable.

9. The self-decoupled RF array according to claim 1, wherein the pattern of array elements forms a one-dimension or two-dimensional RF surface coil array.

10. The self-decoupled RF array according to claim 9, wherein the one-dimensional or two-dimensional RF surface coil array is non-planar.

11. A method for electrically adjusting a self-decoupled radio-frequency (RF) coil array for operation in magnetic resonance imaging (MM), the method comprising:
providing the RF coil array, wherein the RF coil array comprises a loop element and a second element adjacent to the loop element, wherein the loop element comprises a plurality of conductive segments positioned along a path that begins at and ends at the same point;
transmitting RF energy to a feed port in the second element to induce, in the loop element, a non-uniform current resulting from electric field (E-field) and magnetic field (H-field) coupling between the loop element and the second element that is the superposition of (i) a loop-mode current flowing in a first direction and (ii) a dipole-mode current flowing in a second direction that is opposite to the first direction; and adjusting a mode-reactance (Xmode) in series with the loop element so that the loop-mode current induced by the H-field coupling and the dipole-mode current induced by the E-field coupling cancel each other to electromagnetically decouple the loop element from the second element, and wherein
the self-decoupled RF coil array receives and/or transmits RF energy from/to a subject/sample for MRI.

12. The method according to claim 11, wherein the mode-reactance (Xmode) is a capacitance.

13. The method according to claim 11, further comprising:
adjusting at least one arm-reactance (Xarm) in series with the loop element to tune the resonant frequency of the loop element.

14. The method according to claim 11, further comprising:
adjusting a matching-reactance (Xmatch) in series or in parallel with a feed port in the loop element to adjust the input impedance of the loop element.

15. The method according to claim 11, wherein the second element is a dipole element or a monopole element.

16. The method according to claim 11, wherein the second element is a second loop element.

17. The method according to claim 16, further comprising:
transmitting RF energy to the feed port in the loop element to induce, in the second loop element, a non-uniform current that is the superposition of (i) a loop-mode current flowing in a first direction and (ii) a dipole-mode current flowing in a second direction opposite to the first direction; and
adjusting a mode-reactance in series with the second loop element so that the loop-mode current and the dipole-mode current cancel each other.

18. The method according to claim 16, further comprising:
adjusting at least one arm-reactance (Xarm) in series with the second loop element to tune the resonant frequency of the second loop element.

19. The method according to claim 16, further comprising:
adjusting a matching-reactance (Xmatch) in series or in parallel with a feed port in the second loop element to adjust the input impedance of the second loop element.

20. A magnetic resonance imaging (MRI) system, comprising:
a plurality of transmit/receive (T/R) channels; and
an RF coil array comprising at least a loop element and a dipole element that are each connected to one of the plurality of T/R channels, wherein:
the loop element comprises a plurality of conductive segments positioned along a path that begins at and ends at the same point;
transmitting on the dipole element induces a non-uniform current in the loop element resulting from electric field (E-field) and magnetic field (H-field) coupling between the loop element and the dipole element that is the superposition of (i) a loop-mode current flowing in a first direction around the loop and (ii) a dipole-mode current flowing in a second direction opposite to the first direction,
wherein the loop element includes a reactive component (Xmode) that electromagnetically self-decouples the loop element from the dipole element by causing the amplitudes of the loop-mode current induced by the H-field coupling and the dipole-mode current induced by the E-field coupling to be equal,
wherein the self-decoupled RF coil array receives and/or transmits RF energy from/to a subject/sample for MRI.

* * * * *